US012487526B2

(12) United States Patent
Lazreg et al.

(10) Patent No.: US 12,487,526 B2
(45) Date of Patent: Dec. 2, 2025

(54) LITHOGRAPHIC PRINTING PLATE PRECURSOR

(71) Applicant: ECO3 BV, Mortsel (BE)

(72) Inventors: Faïma Lazreg, Mortsel (BE); Johan Loccufier, Mortsel (BE); Thomas Billiet, Mortsel (BE)

(73) Assignee: ECO3 BV, Mortsel (BE)

( * ) Notice: Subject to any disclaimer, the term of this patent is extended or adjusted under 35 U.S.C. 154(b) by 530 days.

(21) Appl. No.: 18/012,319

(22) PCT Filed: Jun. 9, 2021

(86) PCT No.: PCT/EP2021/065455
§ 371 (c)(1),
(2) Date: Dec. 22, 2022

(87) PCT Pub. No.: WO2021/259637
PCT Pub. Date: Dec. 30, 2021

(65) Prior Publication Data
US 2023/0213856 A1 Jul. 6, 2023

(30) Foreign Application Priority Data
Jun. 24, 2020 (EP) .................................... 20181818

(51) Int. Cl.
*G03F 7/004* (2006.01)
*B41C 1/10* (2006.01)
*G03F 7/038* (2006.01)

(52) U.S. Cl.
CPC .......... *G03F 7/0045* (2013.01); *B41C 1/1008* (2013.01); *G03F 7/038* (2013.01); *B41C 2210/04* (2013.01); *B41C 2210/06* (2013.01); *B41C 2210/22* (2013.01)

(58) Field of Classification Search
None
See application file for complete search history.

(56) References Cited

U.S. PATENT DOCUMENTS

2002/0102488 A1* 8/2002 Yanaka ................. B41C 1/1041 430/283.1
2013/0078573 A1* 3/2013 Balbinot ................... B41C 1/10 430/303
2016/0121596 A1* 5/2016 Saito ..................... G03F 7/0045 101/463.1
2023/0311474 A1* 10/2023 Billiet ................... B41C 1/1016 101/463.1

FOREIGN PATENT DOCUMENTS

CN 101253450 A 8/2008
CN 110891789 A 3/2020
EP 1507170 A2 2/2005
EP 1556227 B1 4/2006
EP 1502735 B1 4/2008
EP 3130465 A1 2/2017
EP 2916171 B1 5/2017
EP 3686011 A1 * 7/2020 ........... B41C 1/1016
EP 3715140 A1 * 9/2020 .............. B41M 1/06
JP 2005-049538 A 2/2005
WO WO-2018043125 A1 * 3/2018 ............... G03F 7/00
WO WO 2019/219560 A1 11/2019

OTHER PUBLICATIONS

European Patent Office, International Search Report in International Patent Application No. PCT/EP2021/065455, mailed Sep. 14, 2021, 3 pp.
European Patent Office, Written Opinion in International Patent Application No. PCT/EP2021/065455, mailed Sep. 14, 2021, 5 pp.

* cited by examiner

*Primary Examiner* — Amanda C. Walke
(74) *Attorney, Agent, or Firm* — Leydig, Voit & Mayer, Ltd.

(57) ABSTRACT

A lithographic printing plate precursor is disclosed including a support and a coating comprising (i) a photopolymerisable layer including a polymerisable compound, a photoinitiator and an asymmetrically substituted infrared absorbing compound.

18 Claims, No Drawings

LITHOGRAPHIC PRINTING PLATE PRECURSOR

CROSS-REFERENCE TO RELATED APPLICATIONS

This patent application is the U.S. national phase of copending International Patent Application No. PCT/EP2021/065455, filed Jun. 9, 2021, which claims the benefit of European Patent Application No. 20181818.4, filed Jun. 24, 2020.

TECHNICAL FIELD

The invention relates to a novel lithographic printing plate precursor.

BACKGROUND ART

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Lithographic printing masters are generally obtained by the image-wise exposure and processing of a radiation sensitive layer on a lithographic support. Imaging and processing renders the so-called lithographic printing plate precursor into a printing plate or master. Image-wise exposure of the radiation sensitive coating to heat or light, typically by means of a digitally modulated exposure device such as a laser, triggers a physical and/or chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference in solubility or difference in rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas remain resistant to the developer. Most lithographic plate precursors contain a hydrophobic coating on a hydrophilic support, so that the areas which remain resistant to the developer define the ink-accepting, hence printing areas of the plate while the hydrophilic support is revealed by the dissolution of the coating in the developer at the non-printing areas.

Photopolymer printing plates rely on a working-mechanism whereby the coating—which typically includes free radically polymerisable compounds—hardens upon exposure. “Hardens” means that the coating becomes insoluble or non-dispersible in the developing solution and may be achieved through polymerization and/or crosslinking of the photosensitive coating upon exposure to light and/or heat. Photopolymer plate precursors can be sensitized to blue, green or red light i.e. wavelengths ranging between 450 and 750 nm, to violet light i.e. wavelengths ranging between 300 and 450 nm or to infrared light i.e. wavelengths ranging between 750 and 1500 nm. Optionally, the exposure step is followed by a heating step to enhance or to speed-up the polymerization and/or crosslinking reaction.

In general, a toplayer or protective overcoat layer over the imageable layer is required to act as an oxygen barrier to provide the desired sensitivity to the plate. A toplayer typically includes water-soluble or water-swellable polymers such as for example polyvinylalcohol. Besides acting as barrier for oxygen, the toplayer should best be easily removable during processing and be sufficiently transparent for actinic radiation, e.g. from 300 to 450 nm or from 450 to 750 nm or from 750 to 1500 nm.

The classical workflow of photopolymer plates involves first an exposure step of the photopolymer printing plate precursor in a violet or infrared platesetter, followed by an optional pre-heat step, a wash step of the protective overcoat layer, an alkaline developing step, and a rinse and gum step. However, there is a clear evolution in the direction of a simplified workflow where the pre-heat step and/or wash step are eliminated and where the processing and gumming step are carried out in one single step or where processing is carried out with a neutral gum and then gummed in a second step. Alternatively, on-press processing wherein the plate is mounted on the press and the coating layer is developed by interaction with the fountain and/or ink that are supplied to the plate during the press run, has become very popular. During the first runs of the press, the non-image areas are removed from the support and thereby define the non-printing areas of the plate.

In order to be able to evaluate the lithographic printing plates for image quality, such as for example image resolution and detail rendering (usually measured with an optical densitometer) before mounting them on the press, the lithographic printing plate precursors often contain a colorant such as a dye or a pigment in the coating. However, for photopolymer lithographic printing plates which are processed on-press and thus development of the plate is not carried out before mounting the plate on the press, a previous inspection and discrimination of the plate including colorants is not possible. A solution has been provided in the art by including components to the coating which are able to form upon exposure a so-called “print-out image”, i.e. an image which is visible before processing. Heat-sensitive photopolymer lithographic printing plates may include a dye which absorbs in the visible light wavelength range and changes colour upon heating whereby a print-out image is formed. For example, thermochromic dye technology involves the design of an IR dye containing a thermocleavable group whereby a colour shift is obtained upon exposure with heat and/or light as disclosed in WO2019/219560.

EP 1 507 170 discloses a polymerizable composition comprising a dye including an ester group which is soluble in an organic solvent and in an alkaline aqueous solution and has an absorption at a range of 700 to 1200 nm, a radical polymerization initiator; a compound having an ethylenically unsaturated bond and a binder polymer.

EP 1 502 735 discloses a lithographic printing plate precursor comprising a recording layer containing a polyurethane compound soluble or swellable in water or an aqueous alkali solution and a radical initiator.

EP 1556227 discloses an IR-sensitive composition comprising an initiator system comprising a material capable of absorbing IR radiation, a compound capable of producing radicals, and a specified hetero-substituted aryl acetic acid co-initiator compound.

Thermal photopolymer printing plates which are based on a heat-induced physical and/or chemical reaction typically contain a heat-sensitive coating comprising an infrared dye as light-to-heat conversion compound. Upon exposure to heat and/or to infrared light, the generated heat triggers the imaging mechanism of the heat-sensitive coating. These infrared dyes exhibit strong absorption in the IR wavelength and are ideally evenly distributed throughout the heat-sensitive coating. However, due to for example a possible limited solubility in common coating solvents, it has been observed that the dyes may be unevenly distributed and/or even form aggregates and/or crystals in the coating of the printing plate. As a result, defects or so-called "artefacts" may occur throughout the coating and may deteriorate the lithographic properties of the plate such as for example adhesion problems, a reduced run-length and/or a lower sensitivity of the printing plate.

In conclusion, despite the solutions provided in the art, there is still an urgent need for thermal photopolymer printing plates which are characterized by an improved sensitivity and press life, preferably obtained by on-press processing.

SUMMARY OF INVENTION

It is therefore an object of the present invention to provide a thermal negative-working lithographic printing plate precursor which provides a printing plate with excellent lithographic properties in terms of both sensitivity and press life.

This object is realised by the printing plate precursor defined in claim 1 with preferred embodiments defined in the dependent claims. The printing plate precursor of the present invention has the specific feature that it contains a photopolymerisable layer which includes an asymmetrically substituted infrared absorbing compound. According to the current invention, it was surprisingly found that by incorporating the asymmetrically substituted infrared absorbing compound in the photopolymerisable layer results in a printing plate with an improved sensitivity and press life whereby the formation of aggregates and/or crystals are highly reduced.

It is a further object of the present invention to provide a method for making a lithographic printing plate comprising the steps of:

- image-wise exposing the printing plate precursor including the coating as defined above to heat and/or IR radiation whereby a lithographic image consisting of image areas and non-image areas is formed;
- developing the exposed precursor.

The development is preferably carried out by treating the precursor with a gum solution, however more preferably by mounting the precursor on a plate cylinder of a lithographic printing press and rotating the plate cylinder while feeding dampening liquid and/or ink to the precursor.

Other features, elements, steps, characteristics and advantages of the present invention will become more apparent from the following detailed description of preferred embodiments of the present invention. Specific embodiments of the invention are also defined in the dependent claims.

DESCRIPTION OF EMBODIMENTS

The Lithographic Printing Plate Precursor

The lithographic printing plate precursor according to the present invention is negative-working, i.e. after exposure and development the non-exposed areas of the coating are removed from the support and define hydrophilic (non-printing) areas, whereas the exposed coating is not removed from the support and defines oleophilic (printing) areas. The hydrophilic areas are defined by the support which has a hydrophilic surface or is provided with a hydrophilic layer. The hydrophobic areas are defined by the coating, hardened upon exposing, optionally followed by a heating step. Areas having hydrophilic properties means areas having a higher affinity for an aqueous solution than for an oleophilic ink; areas having hydrophobic properties means areas having a higher affinity for an oleophilic ink than for an aqueous solution.

"Hardened" means that the coating becomes insoluble or non-dispersible for the developing solution and may be achieved through polymerization and/or crosslinking of the photosensitive coating, optionally followed by a heating step to enhance or to speed-up the polymerization and/or cross-linking reaction. In this optional heating step, hereinafter also referred to as "pre-heat", the plate precursor is heated, preferably at a temperature of about 80° C. to 150° C. and preferably during a dwell time of about 5 seconds to 1 minute.

The coating contains at least one layer including a photopolymerisable composition, said layer is also referred to as the "photopolymerisable layer". The coating may further contain a toplayer which is provided on top of the photopolymerisable layer. Optionally, the coating may include other layers such as for example an intermediate layer, located between the support and the photopolymerisable layer and/or between the optional top layer and the photopolymerisable layer, an adhesion improving layer and/or other layers.

The coating of the printing plate precursor is most preferably capable of being developed on-press with dampening liquid and/or ink.

The printing plate of the present invention is preferably exposed at a low energy density, i.e. below 190 mJ/m$^2$; preferably between 70 and 190 mJ/m$^2$; more preferably between 75 and 150 mJ/m$^2$ and most preferably between 80 and 120 mJ/m$^2$.

Photopolymer Coating

Photopolymerisable Compound

The coating has at least one layer including a photopolymerisable composition, said layer is also referred to as the "photopolymerisable layer". The coating may include an intermediate layer, located between the support and the photopolymerisable layer.

The photopolymerisable layer includes at least one polymerisable compound, a photoinitiator, a first infrared absorbing compound and optionally a binder. The photopolymerisable layer has a coating thickness preferably ranging between 0.2 and 5.0 g/m$^2$, more preferably between 0.4 and 3.0 g/m2, most preferably between 0.6 and 1.5 g/m$^2$.

According to a preferred embodiment of the present invention, the polymerisable compound is a polymerisable monomer or oligomer including at least one terminal ethylenic unsaturated group, hereinafter also referred to as "free-radical polymerisable monomer". The polymerisation involves the linking together of the free-radical polymerisable monomers. Suitable free-radical polymerisable monomers include, for example, multifunctional (meth)acrylate monomers (such as (meth)acrylate esters of ethylene glycol, trimethylolpropane, pentaerythritol, ethylene glycol, ethoxylated trimethylolpropane, urethane (meth)acrylate) and oligomeric amine di(meth)acrylates. The (meth)acrylic monomers may also have other ethylenically unsaturated groups or epoxide groups in addition to the (meth)acrylate group. The (meth)acrylate monomers may also contain an acidic (such as a carboxylic acid or phosphoric acid) or basic (such as an amine) functionality.

Suitable free-radical polymerisable monomers are disclosed in [0042] and [0050] of EP 2 916 171.

The Initiator

Any free radical initiator capable of generating free radicals upon exposure directly or in the presence of a sensitizer, is according to this invention a suitable initiator, also referred to herein as photoinitiator. Suitable examples of photoinitiators include onium salts, carbon-halogen bond-containing compounds such as [1,3,5] triazines having trihalomethyl groups, organic peroxides, aromatic ketones, thio compounds, azo based polymerization initiators, azide compounds, ketooxime esters, hexaarylbisimidazoles, metallocenes, active ester compounds, borates and quinonediazides. Of these, onium salts, especially iodonium and/or sulfonium salts are preferable in view of storage stability.

More specific suitable free-radical initiators include, for example, the derivatives of acetophenone (such as 2,2-dimethoxy-2-phenylacetophenone, and 2-methyl-1-[4-(methylthio) phenyll-2-morpholino propan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyl-oxy)-phenyl) phenyliodonium hexafluoroantimonate, triarylsulfonium hexafluorophosphate, triarylsulfonium p-toluenesulfonate, (3-phenylpropan-2-onyl) triaryl phosphonium hexafluoroantimonate, and N-ethoxy(2-methyl) pyridinium hexafluorophosphate, and onium salts as described in U.S. Pat. Nos. 5,955,238, 6,037,098, and 5,629,354); borate salts (such as tetrabutylammonium triphenyl(n-butyl)borate, tetraethylammonium triphenyl(n-butyl)borate, diphenyliodonium tetraphenylborate, diphenyliodonium tetraphenylborate wherein the phenyl groups of the iodonium salt are substituted with a group including at least six carbon atoms, and triphenylsulfonium triphenyl(n-butyl)borate, and borate salts as described in U.S. Pat. Nos. 6,232,038 and 6,218,076,); haloalkyl substituted s-triazines (such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis (trichloromethyl)-6-[(4-ethoxy-ethylenoxy)-phen-1-yl]-s-triazine, and s-triazines as described in U.S. Pat. Nos. 5,955,238, 6,037,098, 6,010,824 and 5,629,354); and titanocene (bis(etha.9-2,4-cyclopentadien-1-yl) bis[2,6-difluoro-3-(IH-pyrrol-1-yl)phenyl) titanium). Onium salts, borate salts, and s-triazines are preferred free radical initiators. Diaryliodonium salts and triarylsulfonium salts are preferred onium salts. Triarylalkylborate salts are preferred borate salts. Trichloromethyl substituted s-triazines are preferred s-triazines. These initiators may have optional substituents and may be used alone or in combination.

Optionally substituted trihaloalkyl sulfones wherein halo independently represents bromo, chloro or iodo and sulfone is a chemical compound containing a sulfonyl functional group attached to two carbon atoms, are particularly preferred initiators. Tribromomethyl phenyl sulfones are most preferred initiators. More details concerning this initiator can be found in patent application WO2019/179995 paragraphs [0029] to [0040].

The amount of the initiator typically ranges from 0.05 to 30% by weight, preferably from 0.1 to 15% by weight, most preferably from 0.2 to 10% by weight relative to the total dry weight of the components in the photopolymerisable composition.

The photopolymerisable layer may also comprise a co-initiator. Typically, a co-initiator is used in combination with a free radical initiator. Suitable co-initiators for use in the photopolymer coating are disclosed in U.S. Pat. Nos. 6,410,205; 5,049,479; EP 1 079 276, EP 1 369 232, EP 1 369 231, EP 1 341 040, US 2003/0124460, EP 1 241 002, EP 1 288 720 and in the reference book including the cited references: Chemistry & Technology UV & EB formulation for coatings, inks & paints—Volume 3—Photoinitiators for Free Radical and Cationic Polymerisation by K. K. Dietliker—Edited by P. K. T. Oldring—1991—ISBN 0 947798161. Specific co-initiators, as described in EP 107 792, may be present in the photopolymerizable layer to further increase the sensitivity. Preferred co-initiators are disclosed in EP 2 916 171 [0051].

A very high sensitivity can be obtained by including an optical brightener in the coating. Suitable examples of optical brighteners as sensitizers are described in WO 2005/109103 page 24, line 20 to page 39. Useful sensitizers can be selected from the sensitizing dyes disclosed in U.S. Pat. Nos. 6,410,205; 5,049,479; EP 1 079 276, EP 1 369 232, EP 1 369 231, EP 1 341 040, US 2003/0124460, EP 1 241 002 and EP 1 288 720.

Specific co-initiators, as described in EP 107 792, may be present in the photopolymerizable layer to further increase the sensitivity. Preferred co-initiators are sulfur-compounds, especially thiols like e.g. 2-mercaptobenzothiazole, 2-mercaptobenzoxazole, 2-mercapto-benzimidazole, 4-methyl-3-propyl-1,2,4-triazoline-5-thione, 4-methyl-3-n-heptyl-1,2,4-triazoline-5-thione, 4-phenyl-3-n-heptyl-1,2,4-triazoline-5-thione, 4-phenyl-3,5-dimercapto-1,2,4-triazole, 4-n-decyl-3,5-dimercapto-1,2,4-triazole, 5-phenyl-2-mercapto-1,3,4-oxadiazole, 5-methylthio-1,3,4-thiadiazoline-2-thione, 5-hexylthio-1,3,4-thiadiazoline-2-thione, mercaptophenyltetrazole, pentaerythritol mercaptopropionate, butyric acid-3-mercapto-neopentanetetrayl ester, pentaerythritol tetra(thioglycolate). Other preferred co-initiators are polythioles as disclosed in WO 2006/048443 and WO 2006/048445. These polythiols may be used in combination with the above described thiols, e.g. 2-mercaptobenzothiazole.

The Infrared Absorbing Compound

The photopolymerizable layer includes an asymmetrically substituted infrared light absorbing compound. The infrared light absorbing compound is preferably a dye which absorbs light between 750 nm and 1300 nm, preferably between 780 nm and 1200 nm, more preferably between 800 nm and 1100 nm. The asymmetrically substituted infrared absorbing dye is presented by Formula I:

Formula I

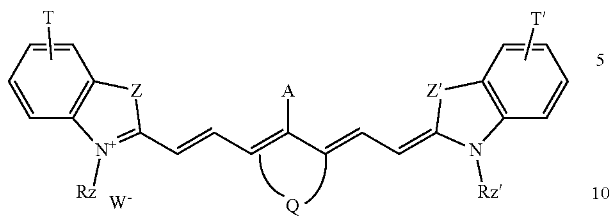

wherein

Z and Z' independently represent —S—, —$CR^aR^b$— or —CH═CH—; $R^a$ and $R^b$ represent an alkyl, aralkyl or aryl group; preferably Z and Z' represent —$CR^aR^b$— wherein $R^a$ and $R^b$ represent an alkyl group, most preferably a methyl or ethyl group;

A represents a halogen, an optionally substituted aliphatic hydrocarbon group, an optionally substituted (hetero) aryl group or —$NR^1R^2$, wherein $R^1$ and $R^2$ independently represent hydrogen, an optionally substituted aliphatic hydrocarbon group or an optionally substituted (hetero)aryl group, and/or combinations thereof;

Q represents the necessary atoms to form a ring;

T and T' independently represent hydrogen, alkyl, halogen, alkoxy, cyano, —$CO_2R''$, —$CONR^kR^m$, —$SO_2R''$, —$SO_2NR^oR^p$ or an optionally substituted annulated benzene ring wherein $R^k$, $R^m$ represent hydrogen, an optionally substituted alkyl or aryl group, $R''$ represents an optionally substituted alkyl or aryl group and $R^o$ and $R^p$ represent hydrogen, an optionally substituted alkyl or aryl group;

$W^-$ represents a counterion in order to obtain an electrically neutral compound; and $R^z$ and $R^{z'}$ independently represent an optionally substituted alkyl group; characterized in that $R^z$ and $R^{z'}$ are different.

T and T' preferably independently represent hydrogen, an alkyl group such as methyl or ethyl; or an optionally substituted annulated benzene ring.

$W^-$ represents a counterion which provides an electrically neutral compound and may be selected from for example a halogen, a sulphonate, a perfluorosulphonate, a tosylate, a tetrafluoro- or tetraphenylborate, a hexafluorophosphate, an arylborate, an arylsulphonate.

Q preferably represents —CHR'—CHR"—, —CR'═CR"— or —CHR'—CHR"—CHR'"— and R', R" and R'" independently represent hydrogen, an optionally substituted alkyl, cycloalkyl, aralkyl, alkaryl, aryl or heteroaryl group, or R' and R" or R" and R'" form together a cyclic structure.

Most preferably Q is represented by Formulae II, III or IV:

Formula II

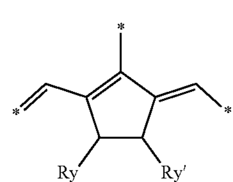

-continued

Formula III

Formula IV

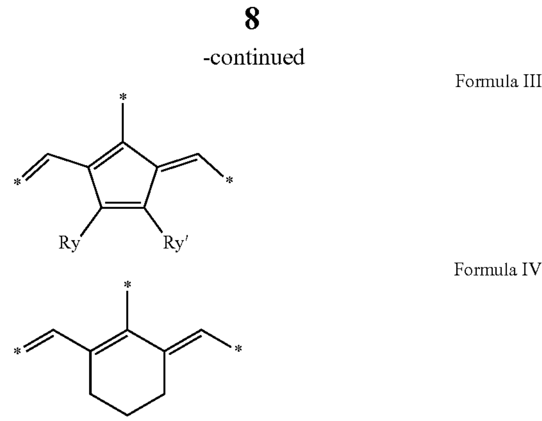

wherein

Ry and Ry' independently represent hydrogen, an optionally substituted alkyl, aralkyl, alkaryl or aryl group or represent the necessary atoms to form a cyclic structure. Preferably, in Formula II, Ry and Ry' independently represent hydrogen or an optionally substituted alkyl group; and in Formula III Ry and Ry' preferably represent an annulated ring, preferably as presented by Formula V:

Formula V

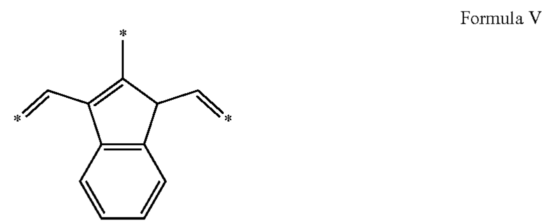 [SMILES: *C1=C(C=*)c2ccccc2C1C=*]

In Formulae II to V, * represents the linking positions to the rest of the dye.

$R^z$ and $R^{z'}$ as defined above are different and independently represent a linear or branched alkyl group. The linear or branched alkyl group is preferably an alkyl group including $C_1$ to $C_{15}$ carbon atoms, more preferably the linear or branched alkyl group is an alkyl group including $C_2$ to $C_{12}$ carbon atoms and most preferably the linear or branched alkyl group is an alkyl group including $C_4$ to $C_{10}$ carbon atoms. The linear or branched alkyl group is preferably selected from a methyl, ethyl, propyl (n-propyl, i-propyl), butyl (n-butyl, i-butyl, t-butyl), pentyl, hexyl, heptyl, octyl, nonyl, decyl, undecyl or dodecyl group, provided that $R^z$ and $R^{z'}$ are different. Highly preferred is that $R^z$ represents a methyl or ethyl group and $R^{z'}$ represents an octyl, nonyl or decyl group.

The Binder

The photopolymerizable layer preferably includes a binder. The binder can be selected from a wide series of organic polymers. Compositions of different binders can also be used. Useful binders are described in for example EP 1 043 627 in paragraph [0013], WO2005/111727 page 17 line 21 to page 19 line 30 and in WO2005/029187 page 16 line 26 to homopolymers or copolymers prepared from monomers such as ethylene, styrene, vinyl chloride, methyl acrylate, ethyl acrylate, methyl methacrylate, ethyl methacrylate, acrylonitrile, vinyl carbazole, acrylate or methacrylate, or mixtures thereof. Preferably the discrete particles are particles which are suspended in the polymerisable composition. The presence of discrete particles tends to promote developability of the unexposed areas.

Thermally reactive polymer fine particles including a thermally reactive group such as an ethylenically unsaturated group, a cationic polymerizable group, an isocyanate group, an epoxy group, a vinyloxy group, and a functional group having an active hydrogen atom, a carboxy group, a hydroxy group, an amino group or an acid anhydride.

The average particle diameter of the polymer fine particle is preferably 0.01 mm to 3.0 mm. Particulate polymers in the form of microcapsules, microgels or reactive microgels are suitable as disclosed in EP 1 132 200; EP 1 724 112; US 2004/106060.

Other Ingredients

The photopolymerisable layer may also comprise particles which increase the resistance of the coating against manual or mechanical damage. The particles may be inorganic particles, organic particles or fillers such as described in for example U.S. Pat. No. 7,108,956. More details of suitable spacer particles described in EP 2 916 171 [0053] to [0056].

The photopolymerizable layer may also comprise an inhibitor. Particular inhibitors for use in the photopolymer coating are disclosed in U.S. Pat. No. 6,410,205, EP 1 288 720 and EP 1 749 240.

The photopolymerizable layer may further comprise an adhesion promoting compound. The adhesion promoting compound is a compound capable of interacting with the support, preferably a compound having an addition-polymerizable ethylenically unsaturated bond and a functional group capable of interacting with the support. Under “interacting” is understood each type of physical and/or chemical reaction or process whereby, between the functional group and the support, a bond is formed which can be a covalent bond, an ionic bond, a complex bond, a coordinate bond or a hydrogen-bond, and which can be formed by an adsorption process, a chemical reaction, an acid-base reaction, a complex-forming reaction or a reaction of a chelating group or a ligand. The adhesion promoting compounds described in EP 2 916 171 [0058].

The photopolymerizable layer may include a leuco dye which forms a coloured compound upon exposure to light and/or heat, preferably infrared light, whereby a print-out image is formed. More information with regards to suitable leuco dyes can be found in unpublished application EP19153178 [0069] to [0085].

The photopolymerisable layer may further include at least one borate compound. The borate compound preferably refers to a chemical compound including a borate anion and preferably a cation as counterion. The borate anion may originate from the counterion of the photoinitiator; e.g. a diphenyliodonium photoinitiator and/or the counterion of the infrared absorbing compound described above or any other salt e.g. sodium tetraphenylborate.

Preferably, the borate anion is a tetrahedral boron anion and may be represented by the following Formula A:

Formula A

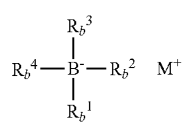

wherein $R_b^1$, $R_b^2$, $R_b^3$ and $R_b^4$ are independently an optionally substituted aliphatic hydrocarbon group, an optionally substituted aryl or heteroaryl group; alternatively, two or more of $R_b^1$, $R_b^2$, $R_b^3$ and $R_b^4$ can be joined together to form a heterocyclic ring with the boron atom, such a ring may include up to seven carbon, nitrogen, oxygen and/or nitrogen atoms. Preferably, $R_b^1$, $R_b^2$, $R_b^3$ and $R_b^4$ are independently an optionally substituted aryl or heteroaryl group. More preferably, $R_b^1$, $R_b^2$, $R_b^3$ and $R_b^4$ are independently an optionally substituted aryl group. Most preferably, the borate compound includes at least one optionally substituted phenyl group, more preferably at least two optionally substituted phenyl groups, even more preferably at least three optionally substituted phenyl groups and most preferably four optionally substituted phenyl groups.

$M^+$ is an alkali metal cation such as e.g. Li+, Na+, K+ or an optional substituted onium ion. Examples of the optionally substituted onium ion include pyridinium, ammonium, iodonium or sulfonium.

Examples of a pyridinium ion include N-alkyl-3-pyridinium group, an N-benzyl-3-pyridinium group, an N-(alkoxy polyalkyleneoxy alkyl)-3-pyridinium group, an N-alkoxycarbonylmethyl-3-pyridinium group, an N-alkyl-4pyridinium group, an N-benzyl-4-pyridinium group, an N-(alkoxy polyalkyleneoxy alkyl)-4-pyridinium group, an N-alkoxycarbonylmethyl-4-pyridinium group, N-alkyl-3,5-dimethyl-4-pyridinium, N-alkyl-3-pyridinium group or N-alkyl-4-pyridinium, an N-methyl-3-pyridinium, an N-octyl-3pyridinium, an N-methyl-4-pyridinium, or an N-octyl-4-pyridinium is particularly preferred, and an Noctyl-3-pyridinium group or an N-octyl-4-pyridinium group is most preferred.

The optional substituted onium ion is preferably an ammonium ion represented by Formula B:

Formula B

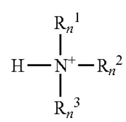

wherein $R_n^1$, $R_n^2$ and $R_n^3$ are independently an optionally substituted aliphatic hydrocarbon group, an optionally substituted aryl or heteroaryl group or a halogen atom.

The optional substituted onium ion is most preferably a iodonium ion; more preferably an optionally substituted dipenyl iodonium salt. Diphenyl iodonium salts substituted with electron-donating groups, for example, alkyl groups or alkoxyl groups, and asymmetric diphenyl iodonium salts are particularly preferred. The phenyl groups of the iodonium ion are preferably substituted with a group including at least six carbon atoms.

Specific examples of borate compounds including a iodonium ion include 4-hexyloxyphenyl-2,4-diethoxyphenyl iodonium tetrafluoroborate, 4-octyloxyphenyl phenyliodonium tetraphenylborate, [4-[(2-hydroxytetradecyl)-oxy]phenyl]phenyliodonium tetraphenylborate, bis(4-t-butylphenyl) iodonium tetraphenylborate, 4-methylphenyl-4'-hexylphenyliodonium tetraphenylborate-4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-5 methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis (pentafluorophenyl)borate, 4-methylphenyl-4'-dodecylphenyliodonium tetrakis(4-fluorophenyl)borate, bis(dodecylphenyl)iodonium tetrakis(pentatluorophenyl)borate, and bis(4-t-butylphenyl)iodonium tetrakis(limidazolyl)borate. Preferred compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate.

The borate compound may be present in an amount comprised between 0.05 and 30% by weight, more preferably between 0.1 and 25% by weight, and most preferably from 0.5 and 15% by weight relative to the components of the photopolymerisable layer.

Various surfactants may be added into the photopolymerisable layer to allow or enhance the developability of the precursor; especially developing with a gum solution. Both polymeric and small molecule surfactants for example nonionic surfactants are preferred. More details are described in EP 2 916 171 [0059].

Toplayer

The coating may include a toplayer or protective overcoat layer which may act as an oxygen barrier layer. Low molecular weight substances present in the air may deteriorate or even inhibit image formation and therefore a toplayer is applied to the coating. A toplayer should preferably be easily removable during development, adhere sufficiently to the photopolymerisable layer or optional other layers of the coating and should preferably not inhibit the transmission of light during exposure. The toplayer is preferably provided on top of the photopolymerisable layer.

The toplayer preferably includes an infrared absorbing compound which is capable of forming a coloured compound—whereby a print-out image is formed—upon exposure to infrared light and/or heat. This infrared absorbing compound is preferably an infrared absorbing dye or IR dye. The colour-forming IR dye is also referred to herein as second infrared absorbing dye, thermochromic infrared absorbing dye or thermochromic IR dye. The thermochromic IR dye has a main absorption in the infrared wavelength range of the electromagnetic spectrum—i.e. a wavelength range between about 750 and 1500 nm—and does preferably not have a substantial light absorption in the visible wavelength range of the electromagnetic spectrum—i.e. a wavelength range between 390 and 700 nm. The thermochromic IR dye preferably includes at least one thermocleavable group which is transformed by a chemical reaction, induced by exposure to IR radiation or heat, into a group which is a stronger electron-donor. As a result, the exposed thermochromic IR dye absorbs substantially more light in the visible wavelength range of the electromagnetic spectrum, or in other words, the thermochromic dye undergoes a hypsochromic shift whereby a visible image is formed, also referred to as print-out image. The formation of this print-out image is clearly different from a process of the prior art where a compound changes from an essentially colourless compound into a pale-coloured to coloured compound. These compounds typically change absorption from the UV wavelength range of the electromagnetic spectrum to the visible wavelength range of the electromagnetic spectrum, i.e. these compounds typically have a batochromic shift. The contrast of the print-out image obtained by such a process is much weaker compared to the colour forming process described above for the thermochromic IR dyes.

The contrast of the print-out image may be defined as the difference between the optical density at the exposed area and the optical density at the non-exposed area, and is preferably as high as possible. This enables the end-user to establish immediately whether or not the precursor has already been exposed and processed, to distinguish the different color selections and to inspect the quality of the image on the plate precursor. The contrast of the print-out image preferably increases with increasing optical density in the exposed areas and can be measured in reflectance using an optical densitometer, equipped with several filters (e.g. cyan, magenta, yellow).

The concentration of the thermochromic IR dyes with respect to the total dry weight of the coating, may be from 0.1% wt to 20.0% wt, more preferably from 0.5% wt to 15.0% wt, most preferred from 1.0% wt to 10.0% wt.

The second infrared absorbing dye is preferably represented by Formula VI

Formula VI

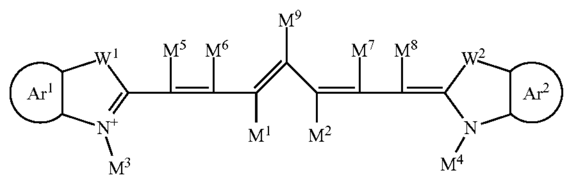

wherein $Ar^1$ and $Ar^2$ independently represent an optionally substituted aromatic hydrocarbon group or an aromatic hydrocarbon group with an annulated benzene ring which is optionally substituted, $W^1$ and $W^2$ independently represent a sulphur atom, an oxygen atom, NR* wherein R* represents an optionally substituted alkyl group, NH, or a $-CM^{10}M^{11}$ group wherein $M^{10}$ and $M^{11}$ independently represent an optionally substituted aliphatic hydrocarbon group or an optionally substituted (hetero)aryl group; or wherein $M^{10}$ and $M^{11}$ together comprise the necessary atoms to form a cyclic structure, preferably a 5- or 6-membered ring;

$M^1$ and $M^2$ independently represent hydrogen, an optionally substituted aliphatic hydrocarbon group or together comprise the necessary atoms to form an optionally substituted cyclic structure which may comprise an optionally substituted annulated benzene ring, preferably $M^1$ and $M^2$ together comprise the necessary atoms to form an optionally substituted cyclic structure which may comprise an optionally substituted annulated benzene ring, preferably a 5- or 6-membered ring, more preferably a 5-membered ring, most preferably a 5-membered ring having a cyclic structure of 5 carbon atoms;

$M^3$ and $M^4$ independently represent an optionally substituted aliphatic hydrocarbon group;

$M^5$, $M^6$, $M^7$ and $M^8$ represent hydrogen, a halogen or an optionally substituted aliphatic hydrocarbon group, $M^9$ is a group which is transformed by a chemical reaction, induced by exposure to IR radiation or heat, into a group which is a stronger electron-donor than said $M^9$; and said transformation provides an increase of the integrated light absorption of said dye between 350 and 700 nm;

and optionally one or more counterions in order to obtain an electrically neutral compound.

The thermochromic IR dye can be a neutral, an anionic or a cationic dye depending on the type of the substituting groups and the number of each of the substituting groups.

In a preferred embodiment, the thermochromic IR dye is represented by Formula VI above and includes $M^9$ represented by one of the following groups:

—(N═$CR^{17}$)a-$NR^5$—CO—$R^4$,

—(N═$CR^{17}$)b-$NR^5$—$SO_2$—$R^6$,

—(N═$CR^{17}$)c-$NR^{11}$—SO—$R^{12}$,

—$SO_2$—$NR^{15}R^{16}$ and

—S—$CH_2$—$CR^7(H)_{1-d}(R^8)_d$—$NR^9$—$COOR^{18}$, wherein a, b, c and d independently are 0 or 1;

$R^{17}$ represents hydrogen, an optionally substituted aliphatic hydrocarbon group or an optionally substituted (hetero)aryl group, or wherein $R^{17}$ and $R^5$ or $R^{17}$ and $R^{11}$ together comprise the necessary atoms to form a cyclic structure;

$R^4$ represents —$OR^{10}$, —$NR^{13}R^{14}$ or —$CF_3$;

wherein $R^{10}$ represents an optionally substituted (hetero) aryl group or an optionally branched aliphatic hydrocarbon group;

$R^{13}$ and $R^{14}$ independently represent hydrogen, an optionally substituted aliphatic hydrocarbon group or an optionally substituted (hetero)aryl group, or wherein $R^{13}$ and $R^{14}$ together comprise the necessary atoms to form a cyclic structure;

$R^6$ represents an optionally substituted aliphatic hydrocarbon group or an optionally substituted (hetero)aryl group, —$OR^{10}$, —$NR^{13}R^{14}$ or —$CF_3$;

$R^5$ represents hydrogen, an optionally substituted aliphatic hydrocarbon group, a $SO_3$— group, a —$COOR^{18}$ group or an optionally substituted (hetero) aryl group, or wherein $R^5$ together with at least one of $R^{10}$, $R^{13}$ and $R^{14}$ comprise the necessary atoms to form a cyclic structure;

$R^{11}$, $R^{15}$ and $R^{16}$ independently represent hydrogen, an optionally substituted aliphatic hydrocarbon group or an optionally substituted (hetero)aryl group, or wherein $R^{15}$ and $R^{16}$ together comprise the necessary atoms to form a cyclic structure;

$R^{12}$ represents an optionally substituted aliphatic hydrocarbon group or an optionally substituted (hetero)aryl group;

$R^7$ and $R^9$ independently represent hydrogen or an optionally substituted aliphatic hydrocarbon group;

$R^8$ represents —COO— or —$COOR^{8'}$ wherein $R^{8'}$ represents hydrogen, an alkali metal cation, an ammonium ion or a mono-, di-, tri- or tetra-alkyl ammonium ion;

$R^{18}$ represents an optionally substituted (hetero)aryl group or an alpha-branched aliphatic hydrocarbon group; and optionally one or more counterions in order to obtain an electrically neutral compound.

Most preferably the thermochromic IR dye is represented by Formula VI wherein $Ar^1$ and $Ar^2$ independently represent an optionally substituted aryl group; optionally annulated with an optionally substituted benzene ring, $W^1$ and $W^2$ represent —$C(CH_3)_2$;

$M^1$ and $M^2$ together comprise the necessary atoms to form an optionally substituted 5-membered ring which may comprise an optionally substituted annulated benzene ring;

$M^3$ and $M^4$ independently represent an optionally substituted aliphatic hydrocarbon group, $M^5$, $M^6$, $M^7$ and $M^8$ represent hydrogen;

$M^9$ represents

—$NR^5$—CO—$R^4$

—$NR^5$—$SO_2$—$R^6$

—$NR^{11}$—SO—$R^{12}$

—$SO_2$—$NR^{15}R^{16}$ wherein $R^4$, $R^5$, $R^6$, $R^{11}$, $R^{12}$, $R^{15}$, and $R^{16}$ are as defined above; and optionally one or more counterions in order to obtain an electrically neutral compound.

In a highly preferred embodiment the thermochromic IR dye is represented by Formula VI wherein $Ar^1$ and $Ar^2$ independently represent an optionally substituted aryl group;

$W^1$ and $W^2$ represent —$C(CH_3)_2$;

$M^1$ and $M^2$ together comprise the necessary atoms to form an optionally substituted 5-membered ring which may comprise an optionally substituted annulated benzene ring;

$M^3$ and $M^4$ independently represent an optionally substituted aliphatic hydrocarbon group, $M^5$, $M^6$, $M^7$ and $M^8$ represent hydrogen;

$M^9$ represents

—$NR^5$—CO—$R^4$

—$NR^5$—$SO_2$—$R^6$ wherein $R^4$ is —$OR^{10}$, wherein $R^{10}$ is an optionally branched aliphatic hydrocarbon group;

$R^5$ represents hydrogen, an optionally substituted aliphatic hydrocarbon group or an optionally substituted (hetero)aryl group, $R^6$ represents an optionally substituted aliphatic hydrocarbon group or an optionally substituted (hetero)aryl group; and optionally one or more counterions in order to obtain an electrically neutral compound.

The thermochromic IR dye described above can be a neutral, an anionic or a cationic dye depending on the type of the substituting groups and the number of each of the substituting groups. In a preferred embodiment, the dye of Formula VI comprises at least one anionic or acid group such as —$CO_2H$, —$CONHSO_2R^h$, —$SO_2NHCOR^i$, —$SO_2NHSO_2R^j$, —$PO_3H_2$, —$OPO_3H_2$, —$OSO_3H$, —S—$SO_3H$ or —$SO_3H$ groups or their corresponding salts, wherein $R^h$, $R^i$ and $R^j$ are independently an aryl or an alkyl group, preferably a methyl group, and wherein the salts are preferably alkali metal salts or ammonium salts, including mono- or di- or tri- or tetra-alkyl ammonium salts. These anionic or acid groups may be present on the aromatic hydrocarbon group or the annulated benzene ring of $Ar^1$ or $Ar^2$, or on the aliphatic hydrocarbon group of $M^3$ or $M^4$. Other substituting groups can be selected from a halogen atom, a cyano group, a sulphone group, a carbonyl group or a carboxylic ester group. Preferrably, at least one of $M^3$ or $M^4$ is terminally substituted with at least one of these groups, more preferably with —$CO_2H$, —$CONHSO_2$-Me, —$SO_2NHCO$-Me, —$SO_2NHSO_2$-Me, —$PO_3H_2$ or —$SO_3H$ groups or their corresponding salt, wherein Me represents a methyl group.

The optional counterions in order to obtain an electrically neutral compound may be selected from for example a halogen, a sulphonate, a perfluorosulphonate, a tosylate, a tetrafluoroborate, a hexafluorophosphate, an arylborate such as an tetraphenylborate, an arylsulphonate; or a cation such as alkali metal salts or ammonium salts, including mono- or di- or tri- or tetra-alkyl ammonium salts.

The thermochromic IR dyes mentioned above may also be coupled to each other or to other IR dyes as to form IR dye dimers or oligomers.

Besides a covalent coupling between two or more thermochromic IR dyes, supra-molecular complexes, comprising two or more thermochromic IR dyes, may also be formed by ionic interactions. Dimers, consisting of two different IR dyes, may be formed for example by an interaction between a cationic and an anionic IR dye, as described in e.g. WO/2004069938 and EP 1 466 728. IR dyes may also be ionically bond to a polymer as e.g. described in EP 1 582 346 wherein IR dyes, comprising two to four sulphonate groups are ionically bonded to a polymer comprising covalently attached ammonium, phosphonium, and sulphonium groups.

Supra-molecular complexes comprising two or more thermochromic IR dyes, may also be formed by hydrogen bonding or dipole-dipole interaction.

Suitable examples of thermochromic IR dyes used in the present invention are described in EP 1 910 082 pages 4 to 8, IRD-001 to IRD-101.

Especially preferred thermochromic IR dye are presented by one of the following formulae:

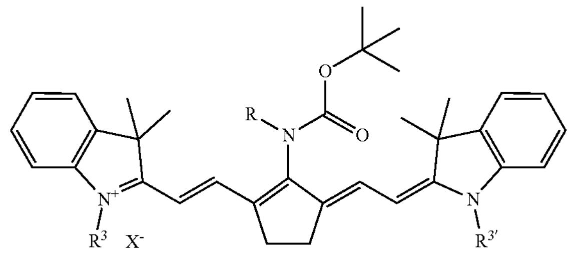

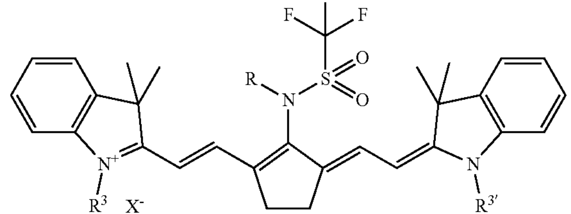

wherein $X^-$ represents halogen, sulphonate, perfluorosulphonate, tosylate, tetrafluoroborate, hexafluorophosphate, arylborate or arylsulphonate; and $R^3$, $R^{3'}$ independently represent an optionally substituted alkyl group, preferably a methyl or ethyl; or an ether group, preferably —$CH_2$—$CH_2$—O—$CH_3$,

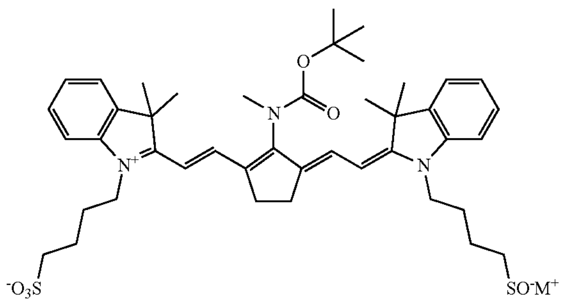

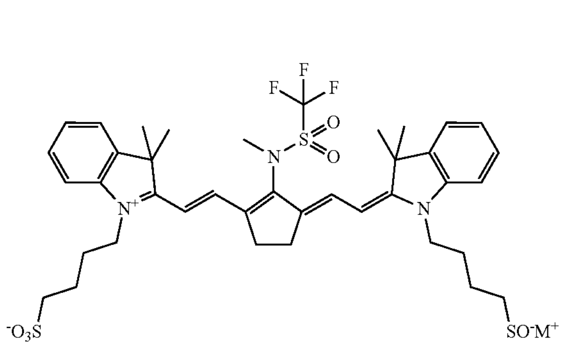

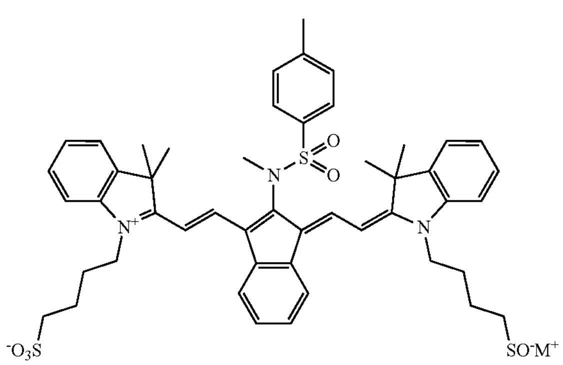

wherein $M^+$=$Li^+$, $Na^+$, $K^+$, $NH_4^+$, R'R"R'"$NH^+$ wherein R', R", R'" independently represent hydrogen, an optional substituted alkyl or aryl group;

Formula VIII

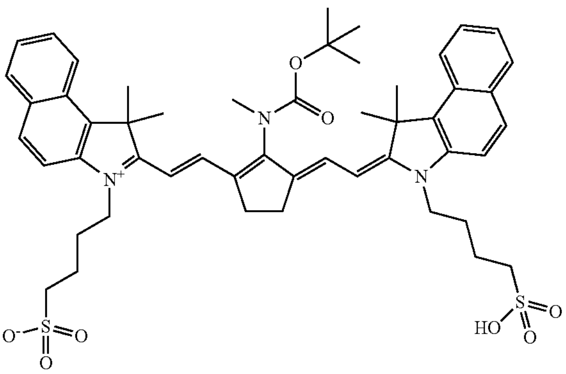

-continued

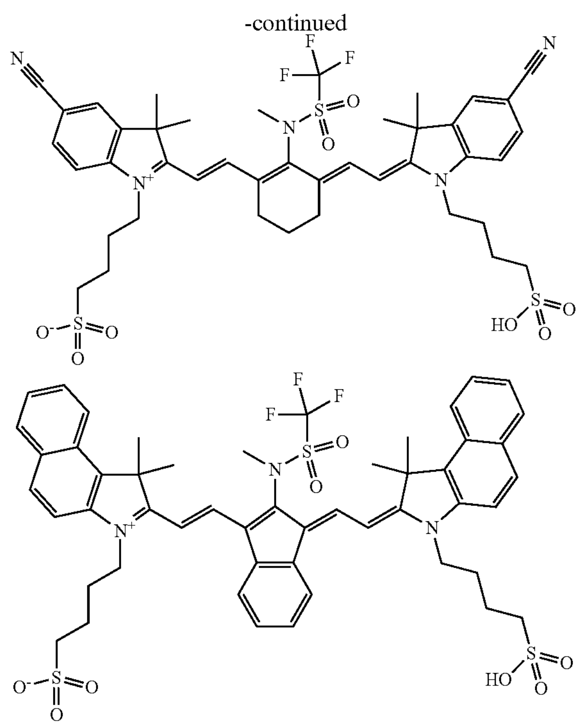

The most preferred thermochromic IR dye is presented by Formula VIII.

The colour difference between the exposed and non-exposed areas of the coating calculated from the L*a*b* values of the image areas (exposed areas) of the coating and the L*a*b* values of non-image areas (non-exposed areas) of the coating, is denoted as ΔE. Upon exposure of the coating of the present invention even with a low energy density, for example between 70 and 190 mJ/m$^2$, more preferably between 75 and 150 mJ/m$^2$, most preferably between 80 and 120 mJ/m$^2$, a print-out image is formed characterised by a CIE 1976 colour difference ΔE of at least 2, more preferably at least 2.5 and most preferably at least 3. According to the present invention, a CIE 1976 colour difference ΔE of at least 2 is obtained at very low exposure energies, for example below 150 mJ/m$^2$. ΔE is the CIE 1976 colour distance Delta E that is defined by the pair wise Euclidean distance of the CIE L*a*b* colour coordinates. CIE L*a*b* colour coordinates are obtained from reflection measurement in 45/0 geometry (non-polarized), using CIE 2° observer and D50 as illuminant. More details are described in CIE S $C_{14}$-4/E: 2007 Colourimetry—Part 4: CIE 1976 L*a*b* Colour Spaces and CIE publications and CIE S $C_{14}$-1/E:2006, CIE Standard Colourimetric Observers.

The CIE 1976 colour coordinates L*, a* and b* discussed herein are part of the well-known CIE (Commission Internationale de l'Eclairage) system of tristimulus colour coordinates, which also includes the additional chroma value C* defined as C*=[(a)2+(b)2]½. The CIE 1976 colour system is described in e.g. "Colorimetry, CIE 116-1995: Industrial Colour Difference Evaluation", or in "Measuring Colour" by R. W. G. Hunt, second edition, edited in 1992 by Ellis Horwood Limited, England.

CIE L*a*b* values discussed and reported herein have been measured following the ASTM E308-85 method.

The toplayer may further include a binder. Preferred binders which can be used in the toplayer are polyvinyl alcohol. The polyvinylalcohol has preferably a hydrolysis degree ranging between 74 mol % and 99 mol %, more preferably between 80-98%. The weight average molecular weight of the polyvinylalcohol can be measured by the viscosity of an aqueous solution, 4% by weight, at 20° C. as defined in DIN 53 015, and this viscosity number ranges preferably between 2 and 26, more preferably between 2 and 15, most preferably between 2 and 10.

The toplayer may include a halogenated polymer which is preferably a hydrophobic polymer, i.e. not soluble or swellable in water at about neutral pH. This binder may be used in the toplayer in the form of a dispersion; i.e. an emulsion or suspension. The amount of the halogenated binder in the toplayer may be between 30% wt and 96% wt, more preferably between 40% wt and 90% wt and most preferably between 50% wt and 85% wt. The halogenated binder preferably includes between 60% wt and 95% wt monomeric units derived from vinylidene monomers such as vinylidene fluoride, vinylidene chloride, vinylidene bromide and/or vinylidene iodide.

The toplayer may optionally include other ingredients such as inorganic or organic acids, matting agents, surfactants such as anionic surfactants, e.g. sodium alkyl sulphate or sodium alkyl sulphonate; amphoteric surfactants, e.g. alkylaminocarboxylate and alkylamino-dicarboxylate; non-ionic surfactants, e.g. polyoxyethylene alkyl phenyl ether, (co)polymers comprising siloxane and/or perfluoroalkyl units and/or oligo(alkylene oxide) units; fillers; (organic) waxes; alkoxylated alkylene diamines as for example disclosed in EP 1 085 380 (paragraph [0021] and [0022]); glycerine; inorganic particles; pigments or wetting agents as disclosed in EP 2 916 171.

The coating thickness of the toplayer is preferably between 0.10 and 1.75 g/m$^2$, more preferably between 0.20 and 1.3 g/m$^2$, most preferably between 0.25 and 1.0 g/m$^2$. In a more preferred embodiment of the present invention, the toplayer has a coating thickness between 0.25 and 1.75 g/m$^2$ and comprises a polyvinylalcohol having a hydrolysis degree ranging between 74 mol % and 99 mol % and a viscosity number as defined above ranging between 2 and 26 mPas.

The hydrophilic polymers in the protective overcoat layer may result in a problematic viscosity increase of press chemicals such as for example fountain solution and/or developer solution. Therefore, the coat weight of the hydrophilic polymers and/or thickness of the protective overcoat layer should preferably not be too high; e.g. above the ranges given above.

Definitions

An aliphatic hydrocarbon group preferably represents an alkyl, cycloalkyl, alkenyl, cyclo alkenyl or alkynyl group; suitable groups thereof are described below. An aromatic hydrocarbon group preferably represents a hetero(aryl) group; suitable hetero(aryl) groups—i.e. suitable aryl or heteroaryl groups—are described below.

The term "alkyl" herein means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl, etc. Examples of suitable alkyl groups are methyl, ethyl, n-propyl, isopropyl, n-butyl, 1-isobutyl, 2-isobutyl and tertiary-butyl, n-pentyl, n-hexyl, chloromethyl, trichloromethyl, iso-propyl, iso-butyl, iso-pentyl, neo-pentyl, 1-methylbutyl and iso-hexyl, 1,1-dimethyl-propyl, 2,2-dimethylpropyl and 2-methyl-butyl, cyclopropyl, cyclobutyl, cyclopentyl, cyclohexyl and methylcyclohexyl groups. Preferably, the alkyl group is a $C_1$ to $C_6$-alkyl group.

A suitable alkenyl group is preferably a $C_2$ to $C_6$-alkenyl group such as an ethenyl, n-propenyl, n-butenyl, n-pentenyl, n-hexenyl, iso-propenyl, iso-butenyl, iso-pentenyl, neo-pentenyl, 1-methylbutenyl, iso-hexenyl, cyclopentenyl, cyclohexenyl and methylcyclohexenyl group.

A suitable alkynyl group is preferably a $C_2$ to $C_6$-alkynyl group; a suitable aralkyl group is preferably a phenyl group or naphthyl group including one, two, three or more $C_1$ to $C_6$-alkyl groups; a suitable alkaryl group is preferably a $C_1$ to $C_6$-alkyl group including an aryl group, preferably a phenyl group or naphthyl group.

A cyclic group or cyclic structure includes at least one ring structure and may be a monocyclic- or polycyclic group, meaning one or more rings annulated or fused together.

Examples of suitable aryl groups may be represented by for example an optionally substituted phenyl, benzyl, tolyl or an ortho- meta- or para-xylyl group, an optionally substituted naphtyl, anthracenyl, phenanthrenyl, and/or combinations thereof. The heteroaryl group is preferably a monocyclic or polycyclic aromatic ring comprising carbon atoms and one or more heteroatoms in the ring structure, preferably, 1 to 4 heteroatoms, independently selected from nitrogen, oxygen, selenium and sulphur. Preferred examples thereof include an optionally substituted furyl, pyridinyl, pyrimidyl, pyrazoyl, imidazoyl, oxazoyl, isoxazoyl, thienyl, tetrazoyl, thiazoyl, (1,2,3)triazoyl, (1,2,4)triazoyl, thiadiazoyl, thiofenyl group and/or combinations thereof.

Halogens are selected from fluorine, chlorine, bromine or iodine.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

The optional substituents on the alkyl, cycloalkyl, alkenyl, cycloalkenyl, alkynyl, aralkyl, alkaryl, aryl and heteroaryl group are preferably selected from —F, —Cl, —Br, —I, —OH, —SH, —CN, —$NO_2$, an alkyl group such as a methyl or ethyl group, an alkoxy group such as a methoxy or an ethoxy group, an aryloxy group, a carboxylic acid group or an alkyl ester thereof, a sulphonic acid group or an alkyl ester thereof, a phosphonic acid group or an alkyl ester thereof, a phosphoric acid group or an ester such as an alkyl ester such as methyl ester or ethyl ester, a thioalkyl group, a thioaryl group, thioheteroaryl, —SH, a thioether such as a thioalkyl or thioaryl, ketone, aldehyde, sulfoxide, sulfone, sulfonate ester, sulphonamide, an amino, ethenyl, alkenyl, alkynyl, cycloalkyl, alkaryl, aralkyl, aryl, heteroaryl or heteroalicyclic group and/or combinations thereof.

Asymmetrically substituted infrared light absorbing compound herein refers to a compound having two sides or halves that are not the same.

Support

The lithographic printing plate used in the present invention comprises a support which has a hydrophilic surface or which is provided with a hydrophilic layer. The support is preferably a grained and anodized aluminium support, well known in the art. Suitable supports are for example disclosed in EP 1 843 203 (paragraphs [0066] to [0075]). The surface roughness, obtained after the graining step, is often expressed as arithmetical mean center-line roughness $R^a$ (ISO 4287/1 or DIN 4762) and may vary between 0.05 and 1.5 μm. The aluminum substrate of the current invention has preferably an $R^a$ value between 0.1 and 1.4 μm, more preferably between 0.3 and 1.0 μm and most preferably between 0.4 and 0.9 μm. The lower limit of the $R^a$ value is preferably about 0.1 μm. More details concerning the preferred $R^a$ values of the surface of the grained and anodized aluminum support are described in EP 1 356 926. By anodising the aluminum support, an $Al_2O_3$ layer is formed and the anodic weight (g/m$^2$ $Al_2O_3$ formed on the aluminum surface) varies between 1 and 8 g/m$^2$. The anodic weight is preferably >2.0 g/m$^2$, more preferably >2.5 g/m$^2$ and most preferably >3.0 g/m$^2$.

The grained and anodized aluminium support may be subjected to so-called post-anodic treatments, for example a treatment with polyvinylphosphonic acid or derivatives thereof, a treatment with polyacrylic acid or derivatives thereof, a treatment with potassium fluorozirconate or a phosphate, a treatment with an alkali metal silicate, or combinations thereof. Treatment of the edges of the support as described in for example US 2017/320351 may be of interest to prevent occurrence of printing edges. Enlargement or sealing of micropores of the amodized aluminum as disclosed in JP2001-253181A or JP2001-322365A may be performed. Alternatively, the support may be treated with an adhesion promoting compound such as those described in EP 1 788 434 in [0010] and in WO 2013/182328. However, for a precursor optimized to be used without a pre-heat step it is preferred to use a grained and anodized aluminium support without any post-anodic treatment.

Besides an aluminium support, a plastic support, for example a polyester support, provided with one or more hydrophilic layers as disclosed in for example EP 1 025 992 may also be used.

According to the present invention there is also provided a method for making a negative-working lithographic printing plate comprising the steps of imagewise exposing a printing plate precursor followed by developing the imagewise exposed precursor so that the non-exposed areas are dissolved in the developer solution. Optionally, after the imaging step, a heating step is carried out to enhance or to speed-up the polymerization and/or crosslinking reaction. The lithographic printing plate precursor can be prepared by (i) applying on a support the coating as described above and (ii) drying the precursor.

Exposure Step

The printing plate precursor is preferably image-wise exposed by a laser emitting IR light. Preferably, the image-wise exposing step is carried out off-press in a platesetter, i.e. an exposure apparatus suitable for image-wise exposing the precursor with a laser such as a laser diode, emitting around 830 nm or a Nd YAG laser emitting around 1060 nm, or by a conventional exposure in contact with a mask. In a preferred embodiment of the present invention, the precursor is image-wise exposed by a laser emitting IR light.

Preheat Step

After the exposing step, the precursor may be pre-heated in a preheating unit, preferably at a temperature of about 80° C. to 150° C. and preferably during a dwell time of about 5 seconds to 1 minute. This preheating unit may comprise a heating element, preferably an IR-lamp, an UV-lamp, heated air or a heated roll. Such a preheat step can be used for printing plate precursors comprising a photopolymerisable composition to enhance or to speed-up the polymerization and/or crosslinking reaction.

Development Step

Subsequently to the exposing step or the preheat step, when a preheat step is present, the plate precursor may be processed (developed). Before developing the imaged precursor, a pre-rinse step might be carried out especially for the negative-working lithographic printing precursors having a protective oxygen barrier or topcoat. This pre-rinse step can be carried out in a stand-alone apparatus or by manually rinsing the imaged precursor with water or the pre-rinse step can be carried out in a washing unit that is integrated in a processor used for developing the imaged precursor. The washing liquid is preferably water, more preferably tap water. More details concerning the wash step are described in EP 1 788 434 in [0026].

During the development step, the non-exposed areas of the image-recording layer are at least partially removed without essentially removing the exposed areas. The processing liquid, also referred to as developer, can be applied to the plate e.g. by rubbing with an impregnated pad, by dipping, immersing, coating, spincoating, spraying, pouring-on, either by hand or in an automatic processing apparatus. The treatment with a processing liquid may be combined with mechanical rubbing, e.g. by a rotating brush. During the development step, any water-soluble protective layer present is preferably also removed. The development is preferably carried out at temperatures between 20 and 40° C. in automated processing units.

In a highly preferred embodiment, the processing step as described above is replaced by an on-press processing whereby the imaged precursor is mounted on a press and processed on-press by rotating said plate cylinder while feeding dampening liquid and/or ink to the coating of the precursor to remove the unexposed areas from the support. In a preferred embodiment, only dampening liquid is supplied to the plate during start-up of the press and after a number of revolutions of the plate cylinder also the ink supply is switched on. In an alternative embodiment, supply of dampening liquid and ink is started simultaneously, or only ink can be supplied during a number of revolutions before switching on the supply of dampening liquid. The feeding of paper may be before, in between or after any of the ink and/or dampening feeding steps.

The processing step may also be performed by combining embodiments described above, e.g. combining development with a processing liquid with development on-press by applying ink and/or fountain.

Processing Liquid

The processing liquid may be an alkaline developer or solvent-based developer. Suitable alkaline developers have been described in US2005/0162505. An alkaline developer is an aqueous solution which has a pH of at least 11, more typically at least 12, preferably from 12 to 14. Alkaline developers typically contain alkaline agents to obtain high pH values can be inorganic or organic alkaline agents. The developers can comprise anionic, non-ionic and amphoteric surfactants (up to 3% on the total composition weight); biocides (antimicrobial and/or antifungal agents), antifoaming agents or chelating agents (such as alkali gluconates), and thickening agents (water soluble or water dispersible polyhydroxy compounds such as glycerine or polyethylene glycol).

Preferably, the processing liquid is a gum solution whereby during the development step the non-exposed areas of the photopolymerisable layer are removed from the support and the plate is gummed in a single step. The development with a gum solution has the additional benefit that, due to the remaining gum on the plate in the non-exposed areas, an additional gumming step is not required to protect the surface of the support in the non-printing areas. As a result, the precursor is processed and gummed in one single step which involves a less complex developing apparatus than a developing apparatus comprising a developer tank, a rinsing section and a gumming section. The gumming section may comprise at least one gumming unit or may comprise two or more gumming units. These gumming units may have the configuration of a cascade system, i.e. the gum solution, used in the second gumming unit and present in the second tank, overflows from the second tank to the first tank when gum replenishing solution is added in the second gumming unit or when the gum solution in the second gumming unit is used once-only, i.e. only starting gum solution is used to develop the precursor in this second gumming unit by preferably a spraying or jetting technique. More details concerning such gum development is described in EP1 788 444.

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such surface protective compounds are film-forming hydrophilic polymers or surfactants. The layer that remains on the plate after treatment with the gum solution preferably comprises between 0.005 and 20 g/m$^2$ of the surface protective compound, more preferably between 0.010 and 10 g/m$^2$, most preferably between 0.020 and 5 g/m$^2$. More details concerning the surface protective compounds in the gum solution can be found in WO 2007/057348 page 9 line 3 to page 11 line 6. As the developed plate precursor is developed and gummed in one step, there is no need to post-treat the processed plate.

The gum solution preferably has a pH value between 3 and 11, more preferably between 4 and 10, even more preferably between 5 and 9, and most preferably between 6 and 8. A suitable gum solution is described in for example EP 1 342 568 in [0008] to [0022] and WO2005/111727. The gum solution may further comprise an inorganic salt, an anionic surfactant, a wetting agent, a chelate compound, an antiseptic compound, an anti-foaming compound and/or an ink receptivity agent and/or combinations thereof. More details about these additional ingredients are described in WO 2007/057348 page 11 line 22 to page 14 line 19.

Drying and Baking Step

After the processing step the plate may be dried in a drying unit. In a preferred embodiment the plate is dried by heating the plate in the drying unit which may contain at least one heating element selected from an IR-lamp, an UV-lamp, a heated metal roller or heated air.

After drying the plate can optionally be heated in a baking unit. More details concerning the heating in a baking unit can be found in WO 2007/057348 page 44 line 26 to page 45 line 20.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

Example 1

1. Synthesis of Infrared Absorbing Dye IR-02

Step 1: the synthesis of 3-ethyl-1,1,2-trimethyl-1H-benzo[e]-indol-3-ium tosylate.

3-ethyl-1,1,2-trimethyl-1H-benzo[e]-indol-3-ium iodide was prepared according to Xing et al. (Macromolecular Chemistry and Physics, 214(5), 578-588 (2013).

40 g (0.109 mol) 3-ethyl-1,1,2-trimethyl-1H-benzo[e]-indol-3-ium iodide was suspended in 300 ml ethyl acetate. 16.7 ml (0.12 mol) triethyl amine was added and the mixture was stirred for one hour. The reaction mixture was extracted with 300 ml water. The ethyl acetate fraction was isolated an dried over MgSO4. A solution of 22.8 g (0.12) p.toluene sulfonic acid monohydrate in 200 ml ethyl acetate was added dropwise. The precipitated crude 3-ethyl-1,1,2-trimethyl-1H-benzo[e]-indol-3-ium tosylate was isolated by filtration, treated with 300 ml ethyl acetate, isolated by filtration and dried. 35.5 g (y: 79.5%) of 3-ethyl-1,1,2-trimethyl-1H-benzo[e]-indol-3-ium tosylate was isolated.

Step 2: the synthesis of 3-decyl-1,1,2-trimethyl-1H-benzo[e]-indol-3-ium tosylate Decyl tosylate was prepared as described below.

1.292 kg (8 mol) decanol and 1.54 kg tosyl chloride were dissolved in 41 isoproyl acetate. 899.5 g (8.8 mol) triethyl amine was added at a rate of 10 ml per minute. The reaction was allowed to continue for 92 hours at room temperature. The precipitated triethyl amine chlorohydrate was removed by filtration and washed with 21 isopropyl acetate. The pooled organic fraction was extracted twice with 21 of 10 w % sodium chloride solution in water and once with 1 l water. The organic fraction was dried over MgSO4 and evaporated under reduced pressure. 2272 g (y: 91%) decyl tosylate was isolated and used in the alkylation without further purification.

Step 2: 1068 g (5 mol) 1,1,2-trimethyl-1H-benzo[e]indole and 2029 g (6.5 mol) decyl tosylate were dissolved in 1500 ml sulfolane. The reaction mixture was heated to 125° C. From 50° C. on all components completely dissolved in the reaction mixture. The reaction was allowed to continue for 6 hours at 125° C. The reaction mixture was cooled to 75° C. and 10 l of ethyl acetate was added. The reaction mixture was allowed to cool down to room temperature and stirred at room temperature for 16 hours. The precipitated crude 3-decyl-1,1,2-trimethyl-1H-benzo[e]-indol-3-ium tosylate was isolated by filtration, washed several times with ethyl acetate and dried. 1818 g (y: 70%) of 3-decyl-1,1,2-trimethyl-1H-benzo[e]-indol-3-ium tosylate was isolated.

Step 3: synthesis of 5-bromo-2-[(E)-2-[(3Z)-3-[(2Z)-2-(5-bromo-1-butyl-3,3-dimethyl-indolin-2-ylidene)ethylidene]-2-chloro-cyclohexen-1-yl]vinyl]-1-butyl-3,3-dimethyl-indol-1-ium;iodide 3.8 g (9.3 mmol) 3-ethyl-1,1,2-trimethyl-1H-benzo[e]-indol-3-ium tosylate, 4.9 g (9.3 mmol) 3-decyl-1,1,2-trimethyl-1H-benzo[e]-indol-3-ium tosylate and 2.4 g (13.95 mmol) 2-chloro-1-formyl-3-(hydroxymethylene)cyclohexene were dissolved in 30 ml ethanol. A mixture of 2.8 g (27.9 mmol) triethyl amine and 9.5 g (93 mmol) acetic anhydride were added. The temperature of the reaction mixture rose to 60° C. The reaction was allowed to continue for 90 minutes at 60° C. The reaction mixture was cooled to 20° C. and 200 ml methylene chloride was added. The mixture was extracted twice with 500 ml water. Methylene choride was exchanged for methyl t.butyl ether using a distillation process. Upon exchange of the solvent, the mixture of dyes precipitated. The methyl t.butyl ether was decanted and the residue was dissolved in 50 ml methylene chloride. The methylene chloride was evaporated to dryness and 6.5 g of a dry residue was isolated, containing 5-bromo-2-[(E)-2-[(3Z)-3-[(2Z)-2-(5-bromo-1-butyl-3,3-dimethyl-indolin-2-ylidene)ethylidene]-2-chloro-cyclohexen-1-yl]vinyl]-1-butyl-3,3-dimethyl-indol-1-ium;iodide. The mixture was used in the lithographic printing plate precursors according to the present invention without further purification.

2. Preparation of the Printing Plate Precursors

Preparation of the Aluminium Support S-01

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l SO42− ions and 5 g/l Al3+ ions at a temperature of 37° C. and a current density of about 100 A/dm2. Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm2, then washed with demineralised water for 11 seconds and dried at 120° C. for 5 seconds.

The support thus obtained was characterized by a surface roughness $R^a$ of 0.35-0.4 μm (measured with interferometer NT1100) and had an oxide weight of 3.0 g/m$^2$.

Preparation of Comparative Printing Plate PP-01 and Inventive Printing Plate PP-02

Photopolymerisable Layer

The photopolymerizable layers PL-01 and PL-02 were produced by coating onto the above described support S-01 the components as defined in Table 1, dissolved in a mixture of 35% by volume of MEK and 65% by volume of Dowanol PM (1-methoxy-2-propanol, commercially available from DOW CHEMICAL Company). The coating solution was applied at a wet coating thickness of 30 μm and then dried at 120° C. for 1 minute in a circulation oven.

TABLE 1 composition of the photosensitive layers

| Ingredients mg/m$^2$ | PL-01 | PL-02 |
|---|---|---|
| FST 510 (1) | 250 | 250 |
| CN 104 (2) | 250 | 250 |
| Ini-01 (3) | 60 | 60 |
| Sodium tetraphenylborate | 20 | 20 |
| IR-01 (4) | 20 | — |
| IR-02 (4) | — | 20 |
| Ruco coat EC4811 (5) | 250 | 250 |
| Tegoglide 410 (6) | 1.5 | 1.5 |
| JPA 528 (7) | 130 | 130 |
| Albritrect CP30 (8) | 20 | 20 |
| Aerosil R972 (9) | 85 | 85 |

(1) FST 510 is a reaction product from 1 mole of 2,2,4-trimethylhexamethylenediisocyanate and 2 moles of hydroxyethyl-methacrylate commercially available from AZ Electronics as a 82 wt. % solution in MEK;

(2) CN 104 is an epoxy acrylate oligomer commercially available from Arkema;

(3) Ini-01 is 4-hydroxyphenyl-tribromomethyl-sulfone (4) IR-01 (commercially available form FEW CHEMICALS) and IR-02 are infrared absorbing compounds represented by the following structure wherein the R-group substitution is summarized in Table 2:

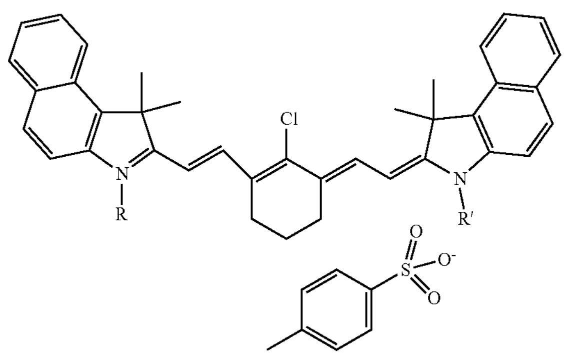

TABLE 2

| R-groups for the different IR dyes | | |
|---|---|---|
| IR dye | R group | R' group |
| IR-01 | —$C_2H_5$ | —$C_2H_5$ |
| IR-02 | —$C_2H_5$ | —$C_{10}H_{21}$ |

(5) Ruco Coat EC4811 is a non-ionic aliphatic polyether polyurethane commercially available from Rudolf GmbH;

(6) Tegoglide 410 is a polyether siloxane copolymer commercially available from Evonik Resource Efficiency GmbH;

(7) JPA 528 is a polyethylene glycol monomethacrylate acid phosphate commercially available from Johoku Chemical Co., Ltd.;

(8) Albritect CP 30, is a copolymer of vinylphosphonic acid and acrylic acid commercially available as a 20 wt. % aqueous dispersion from Rhodia;

(9) Aerosil R972 is a hydrophobic fumed silica commercially available from Evonik Resource Efficiency GmbH.

Protective Overcoat Layer

On top of the photosensitive layer, a solution in water with the composition as defined in Table 3 was coated (40 μm wet film), and dried at 110° C. for 2 minutes. Printing plate precursors PP-01 and PP-02 were obtained (see Table 4 below).

TABLE 3

| Composition of protective overcoat layer OC | |
|---|---|
| INGREDIENTS mg/m$^2$ | OC |
| Mowiol 4-88 (1) | 160 |
| Diofan A050 (2) | 296 |
| Acticide LA1206 (3) | 1 |
| Lutensol A8 (4) | 10 |
| IR-03 (5) | 28 |

(1) Mowiol 4-88TM is a partially hydrolyzed polyvinylalcohol commercially available from Kuraray;

(2) Diofan A050 is a polyvinylidene chloride commercially available from Solvay;

(3) Acticide LA1206TM is a biocide commercially available from Thor;

(4) Lutensol A8TM is a surface active agent commercially available from BASF, (5) IR-03 is an infrared absorbing dye represented by the following structure:

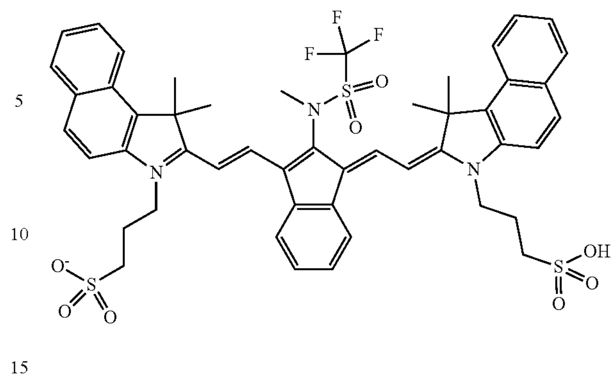

TABLE 4

| Printing plate precursors PPP-01 and PPP-02 | | |
|---|---|---|
| Printing Plate Precursor | Photolayer | IR-dye |
| PPP-01 Comparative | PL-01 | IR-01, symmetrically substituted |
| PPP-02 Inventive | PL-02 | IR-02 Asymmetrically substituted |

3. Crystal Formation

Crystallisation Test

The resulting printing plate precursors were subsequently treated with a rubber wheel (2 cm in diameter) by contact pressure to simulate roller pressure and initiate crystal formation of the IR dye in the imageable layer. After the contact pressure, the printing plate precursors were subjected to a vapour chamber test in Dowanol PM (saturated atmosphere of 2-methoxy propanol). After 3 days of treatment, the lithographic printing plate precursors were visually inspected under 8× optical magnification for crystal formation of the IR dye.

Additionally, samples of each of the printing plate precursors PPP-01 and PPP-02 were subjected to an accelerated ageing test in a climate chamber for 14 days at 40° C. and 80% relative humidity. After this ageing test, the precursor samples were visually inspected under 8× optical magnification for crystal formation of the IR dye.

Results of the Crystallization Tests

The results of the crystal formation (i.e. blooming) in the coating of the printing plate precursors PPP-01 and PPP-02 are summarized in Table 5.

TABLE 5

| Results of the crystal formation test | | |
|---|---|---|
| Printing plate precursor | Blooming after vapour chamber exposure* | Blooming after climate chamber exposure** |
| PPP-01 comparative | C | C |
| PPP-02 inventive | A | A |

*Rating of the amount of crystals observed after 3 days in the vapour chamber test and

**Rating of the amount of crystals observed after 14 days in a climate chamber at 40° C. and 80% relative humidity (RH); wherein A = no crystals observed;

B = some crystals observed;

C = many crystals observed.

The results in Table 5 show that the comparative printing plate precursor PPP-01 has many crystal formation after three days in a vapour chamber and 14 days in a climate chamber exposure while the inventive printing plate precursor s PPP-02 has no crystal formation after these tests.

4. Imaging

The printing plate precursors PPP-01 and PPP-02, both aged and non aged, were subsequently imaged at 2400 dpi with a High Power Creo 40W TE38 thermal Platesetter™ (200 Ipi Agfa Balanced Screening (ABS)), commercially available from Kodak and equipped with a 830 nm IR laser diode, at energy density of 130 mJ/cm$^2$.

5. ΔE Measurement

Lab measurement executed with a GretagMacBeth Spectro Eye reflection spectrophotometer with the settings: D50 (illuminant), 2° (Observer), No filter; commercially available from GretagMacBeth. The total colour difference ΔE is a single value that takes into account the difference between the L, a* and b* values of the image areas and the non-image areas:

$$\Delta E=\sqrt{\Delta L^2+\Delta a^2+\Delta b^2}$$

The higher the total colour difference ΔE, the better the obtained contrast. The contrast between image and non-image areas results in the occurrence of a print-out image.

The Results of the ΔE Measurement

The results of the ΔE measurements are given in Table 6.

TABLE 6

Results of the ΔE measurements

| Printing plate precursor | IR-dye | ΔE |
|---|---|---|
| PPP-01 comparative | IR-01 comparative | 4.7 |
| PPP-02 inventive | IR-02 inventive | 5.8 |

The results in Table 6 show that the generated printout image contrast of the inventive printing plate precursor PPP-02 is significantly higher compared to the image contrast of the comparative printing plate precursor PPP-01.

6. Printing

After imaging, the printing plates were mounted on a Heidelberg GTO 46 printing press. Each print job was started using K+E Skinnex 800 SPEED IK black ink (trademark of BASF Druckfarben GmbH) and 4 wt % Prima FS303 SF (trademark of Agfa Graphics) and 8% isopropanol in water as fountain solution. A compressible blanket was used and printing was performed on non-coated offset paper.

Prior to paper feeding, 10 press revolutions with only the dampening system engaged followed by 5 revolutions with only the inking rollers engaged was performed. The results of the printing are summarized in Table 7.

Results of the Printing Properties Clean-Out and Press Life

The results of the printing properties clean-out and press life are summarized in Table 7.

TABLE 7

Results of clean-out and press life

| Printing plate | IR-dye | Clean out | Press life* Non aged sample | Press life* Aged** sample |
|---|---|---|---|---|
| PP-01 | IR-01 comparative | <25 | A | C |
| PP-02 | IR-02 inventive | <25 | A | B |

*Press life is a rating for the press robustness of the printing plate with
A = no wear after 40.000 impressions,
B = some wear after 40.000 impressions; and
C = heavy wear after 40.000 impressions.
**Climate chamber exposure, see above.

The results of the printing properties in Table 7 show that:

The inventive and comparative printing plates have a good on-press developability (clean out);

The non aged inventive and non aged comparative printing plates have a good press life performance while the press life performance after aging of the comparative printing plate deteriorates more compared to the inventive printing plate.

The invention claimed is:

1. A lithographic printing plate precursor including on a support a coating comprising a photopolymerisable layer including a polymerisable compound, a photoinitiator, and an infrared absorbing dye of Formula I:

Formula I

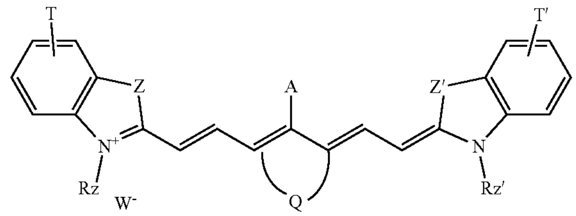

wherein

Z and Z' each independently represent —S—, —CR$^a$R$^b$—, or —CH═CH—, wherein R$^a$ and R$^b$ each independently represent an alkyl, aralkyl, or aryl group;

A represents a halogen, an optionally substituted aliphatic hydrocarbon group, an optionally substituted (hetero) aryl group, or —NR$^1$R$^2$, wherein R$^1$ and R$^2$ each independently represent hydrogen, an optionally substituted aliphatic hydrocarbon group, an optionally substituted (hetero) aryl group, or combinations thereof;

Q represents the necessary atoms to form a ring;

T and T' each independently represent hydrogen, alkyl, halogen, alkoxy, cyano, —CO$_2$R$^n$, —CONR$^k$R$^m$, —SO$_2$R$^n$, —SO$_2$NR$^o$R$^p$, or an optionally substituted annulated benzene ring, wherein R$^k$ and R$^m$ each independently represent hydrogen or an optionally substituted alkyl or aryl group, R$^n$ represents an optionally substituted alkyl or aryl group, and R$^o$ and R$^p$ each independently represent hydrogen or an optionally substituted alkyl or aryl group;

W$^-$ represents a counterion in order to obtain an electrically neutral compound; and $R^z$ and $R^{z'}$ each independently represent an optionally substituted alkyl group, characterized in that $R^z$ and $R^{z'}$ are different.

2. The printing plate precursor of claim 1, wherein Q is represented by Formula II, III, or IV:

Formula II

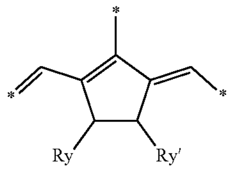

Formula III

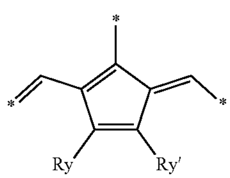

Formula IV

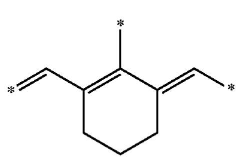

wherein

Ry and Ry' each independently represent hydrogen, an optionally substituted alkyl, aralkyl, alkaryl, or aryl group, or the necessary atoms, when combined, to form a cyclic structure.

3. The printing plate precursor of claim 1, wherein Rz and Rz' each independently represent a linear or branched alkyl group including $C_1$ to $C_{15}$ carbon atoms, provided that Rz and Rz' are different.

4. The printing plate precursor of claim 2, wherein Rz and Rz' each independently represent a linear or branched alkyl group including $C_1$ to $C_{15}$ carbon atoms, provided that Rz and Rz' are different.

5. The printing plate precursor of claim 1, wherein Rz represents a methyl or ethyl group and Rz' represents an octyl, nonyl, or decyl group.

6. The printing plate precursor of claim 2, wherein Rz represents a methyl or ethyl group and Rz' represents an octyl, nonyl, or decyl group.

7. The printing plate precursor of claim 1, wherein the coating further includes a toplayer provided above the photopolymerisable layer.

8. The printing plate precursor of claim 7, wherein the toplayer includes a second infrared absorbing compound which includes a thermocleavable group which transforms into a group which is a stronger electron-donor upon exposure to heat and/or IR radiation, and is capable of forming a print-out image upon exposure to heat and/or IR radiation.

9. The printing plate precursor of claim 8, wherein the second infrared absorbing dye is represented by Formula VI Formula VI

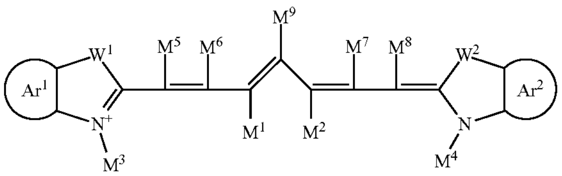

wherein $Ar^1$ and $Ar^2$ each independently represent an optionally substituted aromatic hydrocarbon group or an aromatic hydrocarbon group with an annulated benzene ring which is optionally substituted, $W^1$ and $W^2$ each independently represent a sulphur atom, an oxygen atom, NR*, NH, or a —$CM^{10}M^{11}$ group, wherein R* represents an optionally substituted alkyl group and $M^{10}$ and $M^{11}$ each independently represent an optionally substituted aliphatic hydrocarbon group or an optionally substituted (hetero) aryl group;

$M^1$ and $M^2$ each independently represent hydrogen, an optionally substituted aliphatic hydrocarbon group or the necessary atoms, when combined, to form an optionally substituted cyclic structure which may comprise an optionally substituted annulated benzene ring;

$M^3$ and $M^4$ each independently represent an optionally substituted aliphatic hydrocarbon group;

$M^5$, $M^6$, $M^7$, and $M^8$ each independently represent hydrogen, a halogen, or an optionally substituted aliphatic hydrocarbon group, $M^9$ is a group which is transformed by a chemical reaction, induced by exposure to IR radiation or heat, into a group which is a stronger electron-donor than said $M^9$; and said transformation provides an increase of the integrated light absorption of said dye between 350 and 700 nm;

and optionally one or more counterions in order to obtain an electrically neutral compound.

10. The printing plate precursor of claim 9, wherein $M^1$ and $M^2$ represent the necessary atoms, when combined, to form an optionally substituted cyclic structure which may comprise an optionally substituted annulated benzene ring.

11. The printing plate precursor of claim 9, wherein $M^1$ and $M^2$ represent the necessary atoms, when combined, to form a 5- or 6-membered ring.

12. The printing plate precursor of claim 9, wherein $M^1$ and $M^2$ represent the necessary atoms, when combined, to form a 5-membered ring.

13. The printing plate precursor of claim 9, wherein $M^1$ and $M^2$ represent the necessary atoms, when combined, to form a 5-membered ring having a cyclic structure of 5 carbon atoms.

14. The printing plate precursor of claim 1, wherein $R^a$ and $R^b$ each independently represent an alkyl group.

15. The printing plate precursor of claim 1, wherein $R^a$ and $R^b$ each independently represent a methyl or ethyl group.

16. A method for making a printing plate precursor, the method comprising:

coating on a support (i) a photopolymerisable layer including a polymerisable compound, a photoinitiator, and an infrared absorbing dye as defined in claim 11, and drying the precursor.

17. A method for making a printing plate, the method comprising:

image-wise exposing the printing plate precursor as defined in claim 11 to heat and/or IR radiation whereby a lithographic image consisting of image areas and non-image areas is formed, and developing the exposed precursor.

18. The method for making a printing plate of claim 17, wherein the precursor is developed by mounting the precursor on a plate cylinder of a lithographic printing press and rotating the plate cylinder while feeding dampening liquid and/or ink to the precursor.

* * * * *